United States Patent [19]

Kutner

[11] 4,247,576
[45] Jan. 27, 1981

[54] PROCESS FOR PREPARING SILICATE COATED POLYPROPYLENE FILM

[75] Inventor: Abraham Kutner, Wilmington, Del.

[73] Assignee: Hercules Incorporated, Wilmington, Del.

[21] Appl. No.: 19,942

[22] Filed: Mar. 9, 1979

[51] Int. Cl.³ ............................................. B05D 3/06
[52] U.S. Cl. .................................. 427/40; 427/397.8; 428/446; 428/523; 430/272; 430/273; 430/300
[58] Field of Search ................ 96/83, 35.1; 252/302, 252/313 R, 313 S; 427/372 A, 372 B, 322, 40, 397.8, 397.7; 428/446, 523, 539, 910; 430/300, 272, 273

[56] References Cited

U.S. PATENT DOCUMENTS

| | | | |
|---|---|---|---|
| 2,526,684 | 10/1960 | Powers et al. | 428/446 |
| 3,262,808 | 7/1966 | Crooks et al. | 427/40 |
| 3,445,264 | 5/1969 | Haines | 427/322 |
| 3,470,013 | 9/1969 | Wagner | 427/372 B |
| 3,540,921 | 11/1970 | Ward et al. | 428/539 |
| 4,036,136 | 7/1977 | Takagi | 427/40 |

FOREIGN PATENT DOCUMENTS 7308122  12/1973  Netherlands ............... 428/446

Primary Examiner—Ralph S. Kendall
Assistant Examiner—Sadie L. Childs
Attorney, Agent, or Firm—Marion C. Staves

[57] ABSTRACT

It has been found that thin oriented polypropylene film can be coated with a submicron thickness of an alkali metal silicate. The thus coated film gives excellent results when used to separate the negative from the liquid photopolymer in preparing plastic printing plates.

7 Claims, 3 Drawing Figures

PROCESS FOR PREPARING SILICATE COATED POLYPROPYLENE FILM

This invention relates to silicate coated polypropylene film. More particularly, this invention relates to oriented polypropylene film coated with a submicron thickness of an alkali metal silicate, to its process of preparation and its use in the preparation of printing plates.

In the past, polymer film, particularly uncoated polypropylene film, has been used to separate the negative from the liquid photopolymer when preparing plastic printing plates. In such use, a negative, usually consisting of halftones and line copy, is covered with a thin transparent polymer film (sometimes called a cover film). Over the film is spread a liquid photopolymer and then a backing sheet or substrate is usually added. The cover film serves to protect the negative from the liquid photopolymer. This assembly is exposed through the negative to some form of radiation, e.g., actinic light, for a period of time sufficient to harden the liquid photopolymer in those areas where it is not shielded by the negative. The resulting exposed plate is then separated from the negative and the thin polymer film used to separate the negative from the photopolymer is peeled off the face of the resulting plate. Finally, the unhardened photopolymer is removed, usually by washing, from the unexposed areas and, if desired, the plate is hardened by post-exposure. While uncoated polymer films have been used as separators or cover films in processes as described above, they have caused certain difficulties. For example, the uncoated polypropylene film sometimes sticks to the plate and slivers or tears as it is peeled from it. Also, distortions in the image may occur which take the form of elongated highlight dots and broadened or split rules, which is attributed to photopolymer flow at the interface between the plate relief surface and the uncoated polypropylene film during the imaging (i.e., exposing) step.

It has now been discovered that oriented polypropylene film preferably treated to increase its wettability can be coated with a thin layer of an alkali metal silicate and, when used in preparing printing plates, eliminates slivering or tearing of the film, improves image accuracy, print quality, ink transfer and reduces the surface tack of the resulting printing plate. Accordingly, this invention relates to oriented polypropylene film coated with a submicron thickness (i.e., 50–750 mg./m$^2$, most preferably 100–600 mg./m$^2$) of an alkali metal silicate. The invention further relates to a process of preparing oriented polypropylene film coated with a submicron coating of an alkali metal silicate which comprises preferably treating the said oriented polypropylene film to increase its wettability, coating the film with a colloidal solution of an alkali metal silicate comprising monomeric silicate ions, dimeric silicate ions and polymeric silicate ion micelles having a particle size on the average of no more than 2 millimicrons, and drying the coated film. The invention further relates to an improvement in the process of preparing printing plates by exposing a liquid photopolymer composition through a negative to selectively harden the exposed portion of the photopolymer followed by removal of liquid photopolymer remaining in unexposed areas by washing, the improvement of using an oriented polypropylene film coated with a submicron thickness of an alkali metal silicate to separate the photopolymer from the negative.

BRIEF DESCRIPTION OF THE DRAWING

The above and other objects, features and advantages of the present invention will become more readily apparent from the following description, reference being made to the accompanying drawing in which.

SPECIFIC DESCRIPTION

Figure 1:
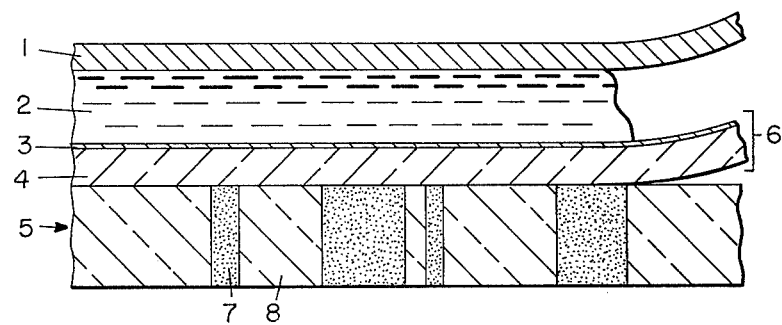
FIG. 1 is a cross-sectional illustration of a typical assembly being laid down for the preparation of a plastic printing plate.
Figure 2:
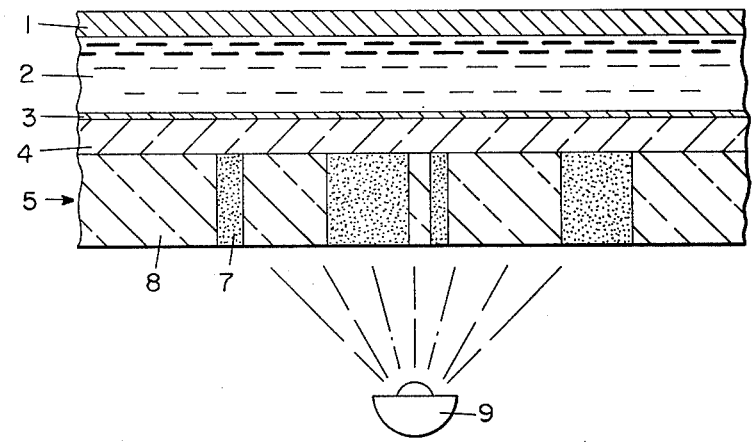
FIG. 2 is a cross-sectional illustration of the assembly being exposed to a light source.
Figure 3:
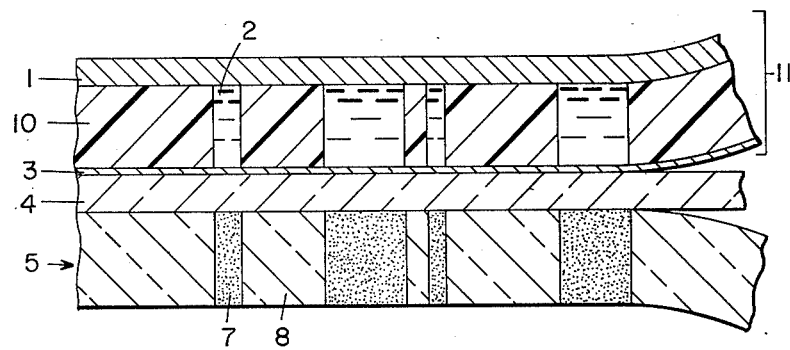
FIG. 3 is a cross-sectional illustration of the assembly being separated after exposure to the light source, the layers of the assembly in each FIG. not being drawn to scale.

Referring to FIGS. 1–3, from which the principles of the present invention may become more readily understandable, it will be observed that in laying down a typical assembly for the preparation of a plastic printing plate using a liquid photopolymer the negative 5 forms the bottom layer. Over the negative 5 and separating it from the liquid photopolymer 2 is laid a cover or separating film 6. The cover film 6 of this invention is an oriented polypropylene film 4 coated on its upper side with a submicron thickness of an alkali metal silicate 3. The liquid photopolymer 2 is spread evenly over the cover film 6 and finally a backing sheet 1 may be placed on top. After the assembly is completed, it is exposed through the negative 5 to a light source 9 for a period of time sufficient to form hardened photopolymer 10 behind those areas where the negative 5 is transparent 8. Behind those areas where the negative 5 is opaque 7, the photopolymer will remain liquid 2. After exposure, the resulting partially hardened photopolymer sheet 11 will be separated from the polypropylene film 4 and negative 5. It will be noted that the submicron thickness of alkali metal silicate 3 preferentially adheres to the solidified areas on the face of the sheet 11. To convert the sheet 11 to a relief printing plate, the liquid photopolymer 2 will be removed (usually by washing) from the unexposed areas.

The oriented polypropylene film used to prepare the coated films of this invention is well known in the art and provides a combination of good clarity, UV transparency, and desirable refractive index, which properties provide good fidelity and etch depth in the reverses of photopolymer relief plates prepared using them. In general, the thickness of the film will be from about 0.25 to about 2.0 mils, most preferably from about 0.5 to about 1.0 mil. So as to provide good coverage of the film surface by the alkali metal silicate colloidal solution, the film will preferably be treated to improve its wettability before it is coated. Various methods of improving the wettability of polypropylene, such as flame treatment, corona discharge and glow discharge, are well known in the art.

The treated oriented polypropylene film will be coated with an aqueous colloidal solution of an alkali metal silicate containing from about 1% to about 20%, most preferably about 4% to about 12%, by weight of alkali metal silicate having an average particle size of no more than 2 millimicrons and from about 0.1% to about 5%, most preferably about 0.3% to about 1.5%, of an anionic or nonionic type surfactant. Typical alkali metal silicates are lithium silicate, sodium silicate, and potassium silicate. The preparation of suitable silicates is well known in the art. For example, the preparation of lithium silicate is described in U.S. Pat. No. 3,455,709.

Various surfactants of the anionic or nonionic type will be used to ensure wetting of the film by the colloidal solution. Typical surfactants which may be used are sodium dioctyl sulfosuccinate, sodium diamyl sulfosuccinate, sodium lauryl sulfate, sodium toluene sulfonate, sodium benzenesulfonate, sodium $C_{14-16}$ alpha-olefin sulfonate, sodium dihexyl sulfosuccinate, sodium tridecyl sulfosuccinate, potassium laurate, sodium stearate, glyceryl monostearate, isooctylphenoxy poly(ethyleneoxy) ethanol, nonylphenoxy poly(ethyleneoxy) ethanol, polyoxyethylated tridecyl alcohol, diethylene glycol laurate, polyoxyethylene palmitate and mixtures thereof.

In addition to the above mentioned essential ingredients of the colloidal solution, it may be desirable to add certain other ingredients such as binders, dyestuffs, fillers and other modifiers. Obviously, there are many cases in which binders, dyestuffs, fillers or other modifiers are not required and excellent results are achieved when only the essential ingredients are employed.

The colloidal solution can be applied to the polypropylene film in a variety of ways, such as by application with a felt applicator, by spray, immersion, doctor rolls, gravure rolls, or by any of the various commercial coating machines. After coating, the film will be dried at an elevated temperature, preferably of about 35° C. to about 150° C., most preferably about 50° C. to about 100° C. Drying times and temperatures will vary, depending on the concentration of the colloidal solution, the coating thickness, and the air flow in the drier. Coated films are conveniently dried by passing through a tower with radiant heat and countercurrent air flow.

The alkali metal silicate coated polypropylene film of this invention can be used for various purposes. It is particularly useful in the preparation of printing plates, where it is used to separate the negative from the liquid photopolymer. Typical liquid photopolymers with which the silicate coated polypropylene films can be used are described in U.S. Pat. Nos. 3,794,494 to Kai et al, 3,960,572 to Ibata et al, and 4,137,081 to Pohl. Typical processes and apparatus in which the silicate coated polypropylene film can be used are described in U.S. Pat. Nos. 3,687,785 to Akamatsu et al, 3,832,177 to Akamatsu et al, and 3,837,887 to Akamatsu et al. The disclosures of the above mentioned U.S. patents are incorporated herein by reference.

It is believed that the silicate coating provides polar functionality on the film surface thereby improving its wettability by the liquid photopolymer and to which the hardening, i.e., crosslinking, photopolymer sticks at the film-photopolymer interface. The use of the surfactant in the coating solution not only provides good wetting of the film by the coating solution, but also reduces adhesion of the coating to the film. Thus, when the film is peeled off the exposed plate, film removal from the plate surface is greatly facilitated. It has been found by energy-dispersive X-ray microanalysis, that the silicate coating transfers from the film to the surface of the printing plate. The surfaces of plates made with the silicate coated films of this invention are thus less tacky than plates made with uncoated film. In addition, it has been shown by scanning electron microscopy that the silicate coating on the surface of the printing plate has a mosaic or mud cracked appearance. This surface provides an increased area capable of picking up more ink from the roller of a printing press and transferring it to the printing substrate. The mottling effect, which sometimes occurs when printing solids, is thereby avoided.

The following examples will illustrate the process of preparing alkali metal silicate coated polypropylene films and their use as cover or separating films in preparing plastic printing plates. All parts and percentages are by weight unless otherwise indicated.

EXAMPLE 1

A commercial grade of lithium silicate having a particle size less than 2 millimicrons, whose preparation is described in U.S. Pat. No. 3,455,709, is diluted with water to a solids content of 9.0%. To this colloidal solution there is added 1.0% by weight of nonylphenyl poly(ethyleneoxy) ethanol (sold under the trade name Igepal ® CO610 by General Aniline & Film Corp.).

This colloidal solution is wiped onto the surface of a 75-gauge (0.75 mil), corona-treated, oriented polypropylene film, with the aid of a soft felt cloth. On drying the film, a good, adherent coating about 0.2 micron thick (approximately 450 mg./m$^2$) is formed.

The thus coated film is used as a cover film over a negative, consisting of halftones and line copy (with the coated side toward the photopolymer) to prepare a polyester type of photopolymer plate as described in U.S. Pat. No. 3,858,510, Example 1, using a commercial exposure unit as described and claimed in U.S. Pat. Nos. 3,687,785 and 3,832,177. On completion of irradiation, the cover film is peeled from the plate surface, and the liquid photopolymer remaining in the non-exposed (i.e., non-image) areas washed away with a mild, aqueous anionic detergent solution. A replica of the image from the negative is left in relief. The plate is post-cured to remove background tack by irradiating it in front of a mercury arc lamp for one minute.

A proof copy of this plate shows a faithful reproduction of the round highlight dots as well as the rules and other image elements present in the negative.

Another plate is prepared using the same negative and resin as above, but with a polypropylene cover film which has not been coated. The cover film has a slight tendency to stick to the plate. A proof copy of this plate shows the presence of elongated highlight dots. In addition, some of the rules are broadened, and in some cases a secondary, irregular line not present in the negative prints adjacent to the rule present in the negative.

EXAMPLE 2

The lithium silicate colloidal solution described in Example 1 is applied to a sheet of 75-gauge oriented polypropylene film with the aid of a spray can containing a fluorocarbon propellant, until it is uniformly wet. The dried film, having a 0.2 micron thick layer (approximately 450 mg./m$^2$) of the silicate, is used to prepare a polyester photopolymer plate as outlined in Example 1.

A proof copy of this plate shows a faithful reproduction of the highlight dots as well as the rules and other elements present in the negative.

EXAMPLE 3

An aqueous colloidal solution of 6% lithium silicate having a particle size less than 2 millimicrons and 0.9% dioctyl sodium sulfosuccinate is prepared and charged into the coating station reservoir of a commercial film coating machine. The colloidal solution is applied at the rate of 2.5 lbs./ream (3,000 ft.$^2$) of 100-gauge, oriented, corona-treated polypropylene film with a 190 line/inch anilox roll having quadrangular shaped cells, at the rate of 150 ft. per minute, then dried in a chamber at 200° F. before being rewound. A clear, glossy 0.12 micron thick coating (approximately 250 mg./m$^2$) is achieved on the film.

A length of 1-in. wide 3 M Scotch ® brand No. 800 tape is applied to the coated surface of the film with a 2400 g. weighted roller. A T-peel test (ASTM 1876, 10-in./min.) indicates that a force of 12 g./in. is required to remove the Scotch ® tape from the coated film. A similar test carried out on uncoated and untreated film requires a force of 365 g./in. to remove the Scotch tape. A corona-treated, uncoated film has a peel value of 420 g./in.

A series of newspaper plates are prepared exactly as described in Example 1, using the coated polypropylene film as a cover film. The plates are mounted on saddles on a newspaper rotary press and printed on newsprint with an oil base ink. Good print fidelity of highlights, rules, and other printing elements is achieved.

A set of plates prepared using uncoated polypropylene cover film, and used for printing in the same manner shows evidence of elongated (distorted) highlight dots, and broadened or secondary rules (which are not present in the negative) adjacent to the rules present in the negative.

EXAMPLES 4-7

A series of lithium silicate and dioctyl sodium sulfosuccinate colloidal solutions are prepared and coated onto 75-gauge, corona-treated polypropylene film in the manner described in Example 3. The coating solution compositions are varied as shown in Table 1, below. All have particle sizes below 2 millimicrons. The resulting T-peel values, carried out in the manner described in Example 3, are given in the table.

TABLE 1

| Ex. | Coating Solution % Solids | | Coating Thickness, microns | Coating Weight mg./m$^2$ | T-Peel, g./in. |
| --- | --- | --- | --- | --- | --- |
| | Lithium Silicate | Dioctyl Sodium Sulfosuccinate | | | |
| 4 | 12.0 | 1.8 | 0.25 | 500 | 18.3 ± 2.3 |
| 5 | 6.0 | 0.9 | 0.12 | 250 | 8.1 ± 1.0 |
| 6 | 6.0 | 0.6 | 0.12 | 250 | 4.5 ± 0.9 |
| 7 | 6.0 | 0.3 | 0.11 | 230 | 13.9 ± 0.8 |

A series of polyester photopolymer plates are prepared exactly as described in Example 1. All of these plates are used for printing on a newspaper rotary press as in Example 3, and give good fidelity of printing of highlights, rules and other printing elements.

EXAMPLE 8

An aqueous colloidal solution of 6.5% lithium silicate having a particle size less than 2 millimicrons, 0.9% dioctyl sodium sulfosuccinate is prepared and charged into the coating station reservoir of a commercial film coating machine. The colloidal solution is applied to untreated oriented polypropylene film having a thickness of 0.5 mil at the rate of 2.5 lbs./ream, with a 200 line/inch anilox roll having quadrangular shaped cells, at the rate of 75 ft./min., then dried in a chamber at 125° F. before being rewound. A clear, glossy coating with a weight of 230 mg./m$^2$ is achieved on the film.

Plates prepared using this film as described in Example 3, afforded good print fidelity of highlights and rules, with only a few isolated elongated dots detected.

EXAMPLE 9

A polyurethane photopolymer as described in Example 4 of U.S. Pat. No. 3,960,572 is used to prepare a printing plate with the cover film described in Example 6 of this application.

After imaging of the plate, the cover film is peeled from the plate surface without difficulty. The non-exposed areas of the plate are washed away with a dilute solution of an alpha-olefin sulfonate surfactant and a silicone defoamer. The plate is then dried, and post-cured in front of a bank of UV fluorescent lamps for 15 minutes. The relief surface of the plate is nontacky to the touch.

A second plate is prepared from the same photopolymer, using an uncoated polypropylene cover film. After imaging of the plate and on attempted peeling of the cover film, it tears in several areas and has to be removed with the aid of tweezers. The washed and post-cured plate is tacky to the touch.

180° Peel tests (ASTM D903) are run to determine the force required to remove the coated and uncoated cover films from solid relief areas of the polyurethane photopolymer described above. The coated and uncoated films have 180° peel values of 26±1 and 127±17 g./in., respectively. Examination of the surface of the solidified photopolymer prepared with the coated cover film by scanning electron microscopy (SEM) shows an irregular mosaic pattern. Analysis of this surface by an energy dispersive X-ray analyzer (EDX) shows the presence of silica to a much higher concentration than the background value for a photopolymer surface prepared with uncoated cover film. The SEM and EDX findings indicate that the silicate coating transfers to the surface of the solidified photopolymer when the coated film is peeled off.

The two printing plates described above are mounted on a flatbed printing press, and printed with an infrared setting ink on an enamel-coated substrate. The plate made with the coated film prints with uniform color density in solid areas, whereas the corresponding areas of the plate made with the uncoated film are somewhat mottled in appearance.

EXAMPLE 10

A polybutadiene photopolymer such as described in U.S. Pat. No. 4,137,081, Example 1, is used to prepare a printing plate with an oriented polypropylene cover film 0.5 mil thick coated with a colloidal solution of 10% of lithium polysilicate having a particle size of less than 2 millimicrons and 0.5% of dioctyl sodium sulfosuccinate, at the rate of 3 lbs. of solution per ream of film (500 mg./m$^2$) according to the procedure of Example 3.

After imaging the plate, the cover film is readily peeled from the plate surface. The unexposed areas of the plate are washed away with a dilute solution of a mild aqueous anionic detergent solution. The plate is then dried and post-cured in front of a bank of UV fluorescent lamps for 15 minutes. The relief surface of the plate is clean, with no evidence of residual resin, and is very slightly tacky.

A second plate is prepared from the same photopolymer, using an uncoated cover film. The cover film has to be removed cautiously from the plate after imaging to prevent tearing the film. After the plate is washed and post-cured, printing elements show evidence of residual photopolymer along the edges of the relief surface. The plate relief surface is moderately tacky.

EXAMPLE 11

A colloidal solution of 8% sodium silicate (Type S35, Philadelphia Quartz) having a particle size of less than 2 millimicrons and 0.8% dioctyl sodium sulfosuccinate was coated onto the surface of corona-treated, oriented 1.25 mil polypropylene film and used in preparing a polyester photopolymer plate in the manner described in Example 3. A proof copy of this plate showed a faithful reproduction of the highlight dots, rules and other elements present in the negative.

What I claim and desire to protect by Letters Patent is:

1. The process of preparing cover film used to separate the negative from the liquid photopolymer when preparing plastic printing plates comprising oriented polypropylene film coated with a submicron coating of an alkali metal silicate, which silicate coating preferentially adheres to the hardened photopolymer when the cover film is separated from the hardened photopolymer, which comprises coating oriented polypropylene film having a thickness of from about 0.25 to about 2.0 mils with an aqueous colloidal solution of an alkali metal silicate containing from about 1% to about 20% by weight of alkali metal silicate having an average particle size of no more than 2 millimicrons and from about 0.1% to about 5% by weight of at least one anionic or nonionic type surfactant and drying the thus coated film.

2. The process of claim 1 wherein the oriented polypropylene film is first treated to increase its wettability.

3. The process of claim 2 wherein the oriented polypropylene film is treated with corona discharge to increase its wettability.

4. The process of claim 1 wherein the alkali metal silicate is lithium silicate.

5. The process of claim 1 wherein the alkali metal silicate is sodium silicate.

6. The process of claim 1 wherein the surfactant is dioctyl sodium sulfosuccinate.

7. The process of claim 1 wherein the surfactant is nonylphenyl poly(etheneoxy)ethanol.

* * * * *